(12) United States Patent
Raghavan et al.

(10) Patent No.: US 8,390,493 B1
(45) Date of Patent: Mar. 5, 2013

(54) LOW-NOISE VOLTAGE REFERENCE GENERATOR WITH DIGITALLY-FILTERED REFERENCE MATCHING

(75) Inventors: Harish Raghavan, Austin, TX (US); John Christopher Tucker, Austin, TX (US); Scott Allan Woodford, Austin, TX (US); Daniel John Allen, Austin, TX (US); Anand Ilango, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 433 days.

(21) Appl. No.: 12/827,468

(22) Filed: Jun. 30, 2010

Related U.S. Application Data

(60) Provisional application No. 61/302,755, filed on Feb. 9, 2010.

(51) Int. Cl.
*H03M 1/00* (2006.01)
(52) U.S. Cl. .......................................... 341/142; 324/95
(58) Field of Classification Search .................. 341/142, 341/154, 145; 323/313, 314, 315, 316, 907; 327/540, 513, 530, 83, 378, 538, 535, 537, 327/545, 546, 543; 27/355
See application file for complete search history.

(56) References Cited

U.S. PATENT DOCUMENTS 7,554,310 B2 * 6/2009 Chapuis et al. ............... 323/282

* cited by examiner

*Primary Examiner* — Joseph Lauture
(74) *Attorney, Agent, or Firm* — Mitch Harris, Atty at Law, LLC; Andrew M. Harris

(57) ABSTRACT

A voltage reference circuit provides a precision voltage reference output without requiring a filter capacitor. The voltage reference output is generated by a digitally-controlled source, which has a value set by the output of a digital filter that filters the output of a comparison circuit that compares the voltage reference output to another reference. A selectable mode can be provided to provide a fast response during a startup/reset period and an optional hold or narrowband response after startup. The mode selection may also offer selection of an externally-supplied digital control value and/or a resistor divider type voltage reference as an alternative to the digitally-controlled source.

20 Claims, 4 Drawing Sheets

LOW-NOISE VOLTAGE REFERENCE GENERATOR WITH DIGITALLY-FILTERED REFERENCE MATCHING

The present U.S. Patent application claims priority under 35 U.S.C. 119(e) to U.S. Provisional Patent Application Ser. No. 61/302,755 filed on Feb. 9, 2010.

BACKGROUND OF THE INVENTION

1. Field of the Invention

The present invention relates generally to DC voltage reference circuits, and more specifically, to low-noise voltage reference circuits and techniques that do not require large filter capacitors.

2. Background of the Invention

Voltage references are needed in most mixed-signal applications such as digital-to-analog converter (DAC) circuits and analog-to-digital converter (ADC) circuits, among others. In order to provide a low-noise and precise voltage reference, an indicator of the value of the DC output voltage of the reference is typically compared to another reference voltage, such as the output voltage of a bandgap circuit. In order to make such a comparison, and in order to provide a low noise reference voltage output in general, the DC output voltage of the reference is typically filtered to remove noise and other variations such as power supply ripple that affect the instantaneous value of the DC output voltage. The filter is typically a capacitor (or multiple parallel capacitors) having a low equivalent series resistance (esr), and often, an external terminal is required for integrated circuit (IC) voltage references, so that a suitable filter capacitor can be provided external to the IC die.

Terminals are always at a premium in IC designs and may determine the size and cost of the IC due to package selection. Also, an external capacitor adds cost to the circuit. Alternatively, if a suitable capacitor can be provided on a die, the real estate required usually will burden the design and is therefore undesirable.

Therefore, it would be desirable to provide a low-noise voltage reference that does not require a large internal or external filter capacitor for low noise operation.

SUMMARY OF THE INVENTION

The above stated objective of providing a low-noise voltage reference without requiring a large and/or external filter capacitor is accomplished in a voltage reference circuit and method. The method is a method of operation of the voltage reference circuit.

The voltage reference includes a digitally-controlled voltage reference generator that generates the voltage reference output according to a digital control value. The voltage reference also includes a comparison circuit for comparing the output to another reference voltage level, and a digital filter that filters the output of the comparison circuit to provide an output representing a long-term average of the output of the comparison circuit. The output of the digital filter is coupled to the digital input of the voltage reference so that feedback is provided to reduce DC error in the output.

The voltage reference may have a selectable operating mode in which the bandwidth of the digital filter is either constant, or transitions from a wide bandwidth/fast response at startup or reset to a slow response once a predetermined time period has elapsed. Alternatively, or in another operating mode, the output value of the digital filter may be held constant once the predetermined time has elapsed. The mode selection may also include selection of an external digital input value for controlling the reference directly or a selection of a resistor divider as a direct reference input as an alternative to the output of the digitally-controlled reference.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses voltage reference circuits that include techniques for reducing a noise and error at the voltage reference output by comparing transitions in the output of a digitally-controlled voltage reference generator with another reference and then digitally filtering the result to provide a control input to the digitally-controlled voltage reference generator.

Figure 1:
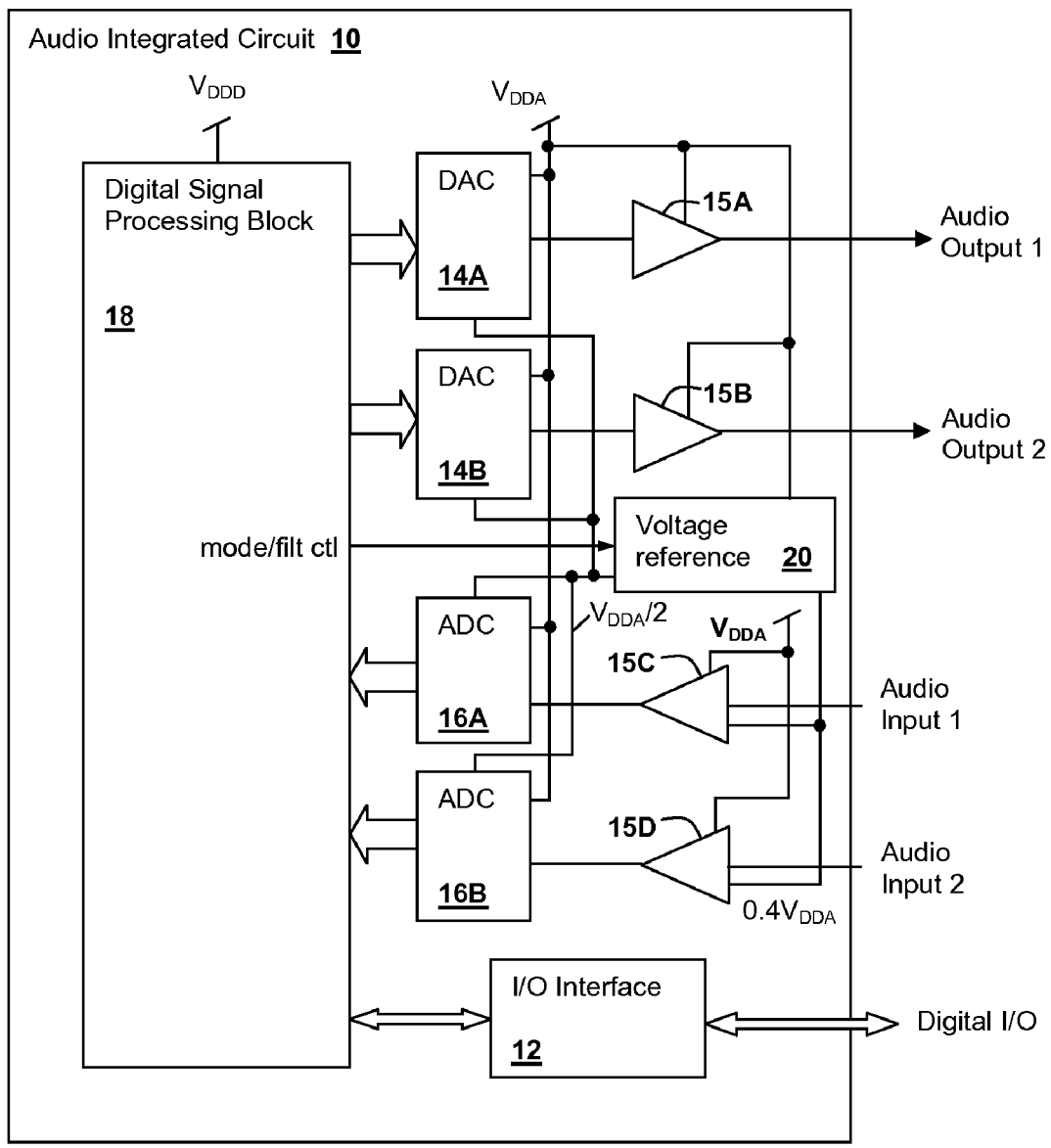
FIG. 1 is a block diagram depicting an audio integrated circuit (IC) 10 including a voltage reference 20 in accordance with an embodiment of the present invention.

Referring now to FIG. 1, an audio IC 10, in accordance with an embodiment of the present invention, is shown. Audio IC 10 includes a digital signal processing block 18 that is coupled to audio outputs audio output 1 and audio output 2 via digital to analog converters (DACs) 14A-14B that provide inputs to corresponding amplifiers 15A-15B. Digital signal processing block is also coupled to audio inputs audio input 1 and audio input 2 by analog-to-digital converters (ADCs) 16A-16B and corresponding amplifiers 15C-15D. An input/output (I/O) interface 12 provides for connection of audio IC 10 to a larger processing system through interface Digital I/O.

Audio IC 10 is an example of a mixed-signal IC in which techniques of the present invention are practiced and is not intended to limit the present invention to any particular type of IC, as reference voltage circuits are needed in many applications. The present invention is embodied in a voltage reference circuit such as voltage reference circuit 20 of audio IC 10, which generates a reference voltage $V_{DDA}/2$ from an analog power supply voltage $V_{DDA}$. Analog power supply voltage $V_{DDA}$ supplies power supply voltage to the analog and mixed-signal portions of audio IC 10, e.g., DACs 14A-14B, ADCs 16A-16B and amplifiers 15A-15D. Power to digital signal processing block 18, as well as I/O interface 12 and any other digital portions of audio IC 10, is provided by digital power supply voltage $V_{DDD}$.

Reference voltage $V_{DDA}/2$ provides a common-mode voltage reference to DACs 14A-14B, ADCs 16A-16B and amplifiers 15A-15B, which is generally needed in single-supply (i.e., single polarity supply) mixed-signal ICs such as audio IC 10. While differential techniques are generally used throughout the analog portions of audio IC 10, the analog circuits must still be biased, generally near the midpoint of the midpoint of analog power supply voltage $V_{DDA}$. Multiple reference voltages may be needed in audio IC 10, which are exemplified by reference voltage $V_{DDA}/2$ and another bias voltage $0.4V_{DDA}$, that is used to bias amplifiers 15C-15D. Voltage reference 20 can generate two or more low-noise reference voltage outputs without requiring large external capacitor(s) for filtering power supply ripple and other sources of noise.

Figure 2:
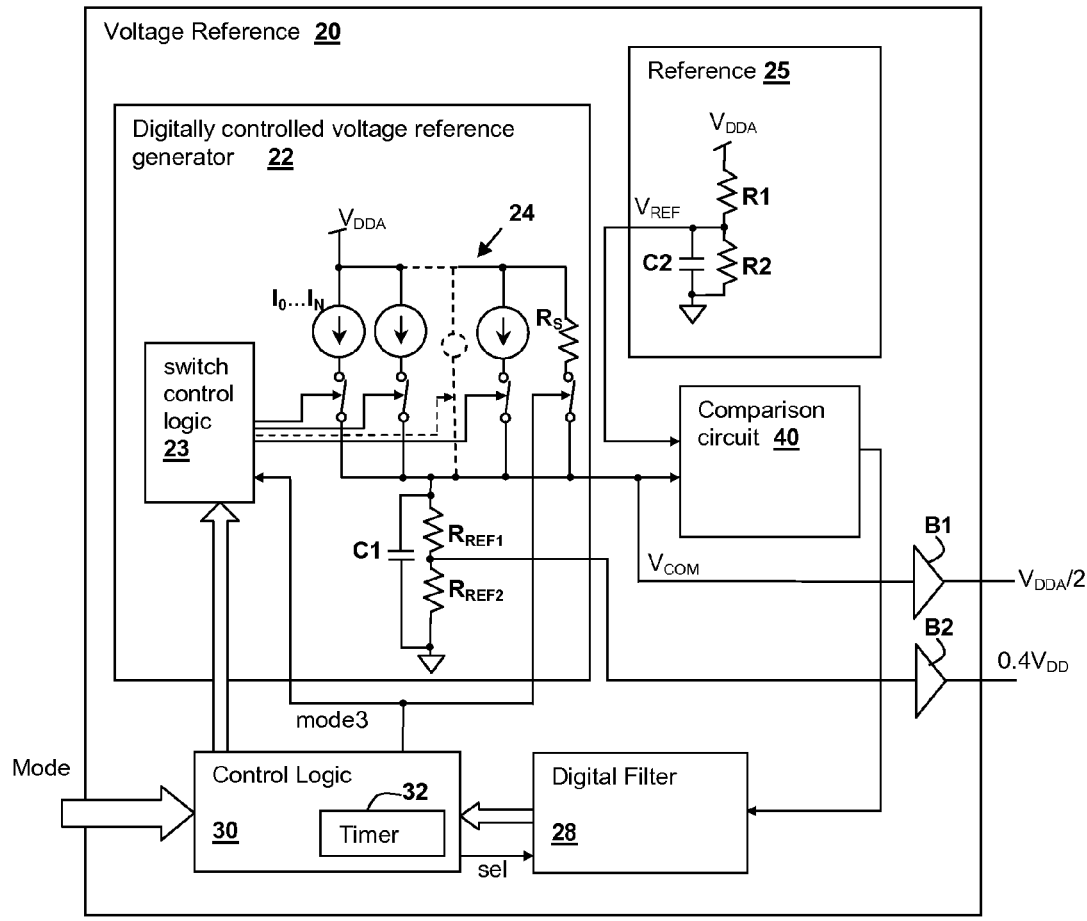
FIG. 2 is a simplified schematic diagram depicting details of voltage reference 20 within audio IC 10 of FIG. 1.

Referring now to FIG. 2, details of voltage reference 20 in accordance with an embodiment of the present invention are shown. A digitally-controlled voltage reference generator 22 provides a voltage reference generator output voltage $V_{COM}$ that is buffered by a buffer B1 to provide reference voltage $V_{DDA}/2$. Voltage reference generator output voltage $V_{COM}$ may also be used to bias some circuits directly, such as circuits that are not switched and therefore do not introduce noise due to charging and discharging currents drawn from the reference voltage node. Bias voltage $0.4V_{DDA}$ is also generated by digitally-controlled voltage reference generator 22 and is buffered by a buffer B2.

Digitally-controlled voltage reference generator 22 includes a digitally-controlled current source, which may also be referred to as current-mode DAC or IDAC, made up of a switch control logic block 23 and a plurality of current sources $I_0$-$I_N$ that are selectively enabled by switch control logic 23 in conformity with a digital control value provided from control logic 30. Switch control logic 23 may also disable all of current sources $I_0$-$I_N$ when a control signal mode3, also provided from control logic 30, is asserted. When control signal mode3 is active, in a particular operating mode of voltage reference 20 as will be explained in further detail below, voltage reference generator output voltage $V_{COM}$ is coupled to analog power supply voltage $V_{DDA}$ by resistor $R_S$, rather than by current sources $I_0$-$I_N$.

The current provided by enabled ones of current sources $I_0$-$I_N$ (or by resistor $R_S$ in operating mode 3), causes voltage reference generator output voltage $V_{COM}$ to appear across resistors $R_{REF1}$ and $R_{REF2}$, which have resistance values selected to produce the appropriate voltages at voltage reference generator output voltage $V_{COM}$ and at bias voltage $0.4V_{DDA}$. A capacitor C1 is provided to filter high frequency components of voltage reference generator output voltage $V_{COM}$, but capacitor C1 is not required to be the typical large external capacitor that is required in other reference voltage generators. The present invention removes noise due to power supply ripple from generating ripple in voltage reference generator output voltage $V_{COM}$. For overall low-noise operation, current sources $I_0$-$I_N$ can be of low thermal noise design and the voltage drops across resistors $R_{REF1}$ and $R_{REF2}$ maintained at very low values so that thermal noise contributions are reduced as well.

A comparison circuit 40 compares voltage reference generator output voltage $V_{COM}$ with another reference voltage $V_{REF}$ generated by another voltage reference circuit 25, which in the illustrated example is provided by a voltage divider formed by resistors R1-R2 and a capacitor C2. Capacitor C2 can also be a small internal capacitor, since resistors R1-R2 can be high impedance and again, only high frequency noise must be removed from reference voltage $V_{REF}$.

Comparison circuit 40 provides an input to a digital filter 28 that generates a long term average of comparisons made between reference voltage $V_{REF}$ and voltage reference generator output voltage $V_{COM}$. The output of digital filter 28 produces a slowly changing value that updates control logic 30 to then update the digital control value provided to switch control logic 23 of digitally-controlled voltage reference generator 22, forming a closed loop feedback mechanism that maintains the DC value of voltage reference generator output voltage $V_{COM}$ substantially at the voltage level of reference voltage $V_{REF}$. Therefore, the function of capacitors C1 and C2 is to attenuate high-frequency components of voltage reference generator output voltage $V_{COM}$ and reference voltage $V_{REF}$, respectively that might otherwise be aliased at multiples of the update rate of the input of digital filter 28 to baseband, which could then affect the DC value of voltage reference generator output voltage $V_{COM}$ as set by the feedback loop through comparison circuit 40 and digital filter 28. Since the actual value of voltage reference generator output voltage $V_{COM}$ (except in mode 3 as explained below) is set only by current sources $I_0$-$I_N$, power supply ripple and other noise present on analog power supply voltage $V_{DDA}$ are substantially attenuated at voltage reference generator output voltage $V_{COM}$ without requiring an analog filter to attenuate lower frequencies.

As mentioned above, voltage reference 20 has several operating modes, as listed in the Table I below:

TABLE I

| Mode | Digital Filter | Reference source | Notes |
| --- | --- | --- | --- |
| 0 | N/A | IDAC set by fixed external value | Used for applications in which external digital control of $V_{com}$ is desired |
| 1 | Active during initial calibration, then output value held constant | IDAC controlled by digital filter | Minimum variation in $V_{com}$ after startup |
| 2 | Fast response at startup, slower response afterward | IDAC controlled by Digital Filter | Best tracking of drift in offset |
| 3 | Fixed reference value set by resistances. | Voltage divider formed by resistor $R_s$ and reference resistors | Comparison and fail-safe mechanism to bypass digital loop |

In mode 0, an externally supplied digital value is provided to control logic 30 along with the mode control information Mode, which sets the enabled ones of current sources $I_0$-$I_N$ according to the externally supplied digital value. In mode 1, the digital control loop described above is used, except that when a period determined by a timer 32 within control logic 30 has elapsed, the output of digital filter 28 is latched by control logic 30. Control logic 30 then holds the value until another calibration is commenced by resetting audio IC 10, selecting a mode via mode control information Mode or another command that causes audio IC 10 to re-calibrate voltage reference 20. Mode 1 provides for accurate removal of offset from voltage reference generator output voltage $V_{COM}$, but maintains a fixed setting of the enabled ones of current sources $I_0$-$I_N$ so that no variation is introduced after calibration by the digital feedback loop.

In mode 2, the digital feedback loop remains active during all phases of operation. However, at the expiration of a time period set by timer 32, a control signal sel is de-asserted, changing the response of digital filter 28 from a fast response used during start-up, to a slower response that reduces the rate of variation in voltage reference generator output voltage $V_{COM}$ due to the corrections made by the digital feedback loop. The above exemplary modes are not exhaustive, but provide examples of the types of control that may be employed within and in communication with voltage reference 20. For example, timer 32, which in general may be a programmable timer set by information provided with the mode control information Mode, may time two periods, and at the end of the first period, slow the response rate of digital filter 28 by de-asserting control signal sel, and then holding the value of the output of digital filter 28 after the second period has expired. Further, digital filter 28 may have more than two response rates, selected according to additional operating modes, or a programmable value. For example digital filter 28 may be an up/down counter circuit that accumulates a control value in higher-order bits that are used to set the enabled ones of current sources $I_0$-$I_N$. The response of the counter may be set by changing the output bits used for the control, or by changing the update rate of the counter.

Figure 3A:
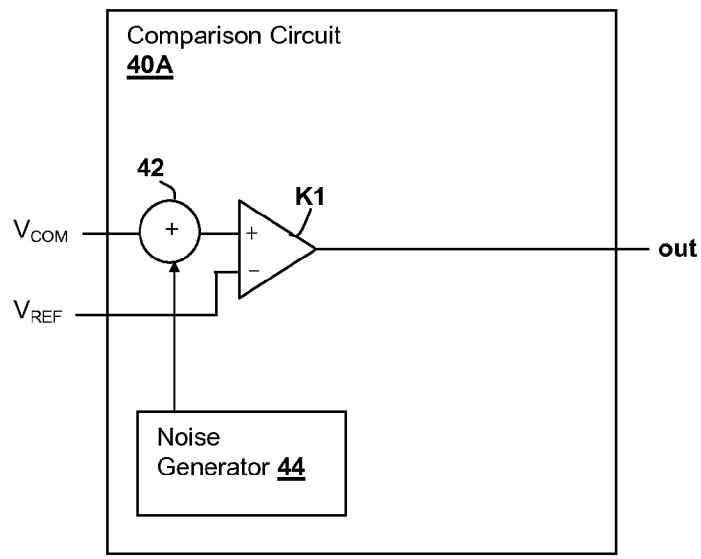
FIG. 3A is a schematic diagram depicting a comparison circuit 40A that may be used to implement comparison circuit 40 in voltage reference circuit 20 of FIG. 2, in accordance with an embodiment of the present invention.

Referring now to FIG. 3A, a comparison circuit 40A that may be used to implement comparison circuit 40 of FIG. 2, is shown in accordance with an embodiment of the invention. Exemplary comparison circuit 40A includes a comparator K1 that is dithered by adding a noise signal generated by a noise generator 44 to voltage reference generator output voltage $V_{COM}$ using a combiner 42 that provides one of the inputs to comparator K1. The other input of comparator K1 is provided with reference voltage $V_{REF}$. Comparison circuit 40A represents a dithered comparison circuit, in which hysteresis is provided by the digital feedback loop alone, i.e., by the relative lag time of the loop and the step size of the IDAC formed by current sources $I_0$-$I_N$.

Figure 3B:
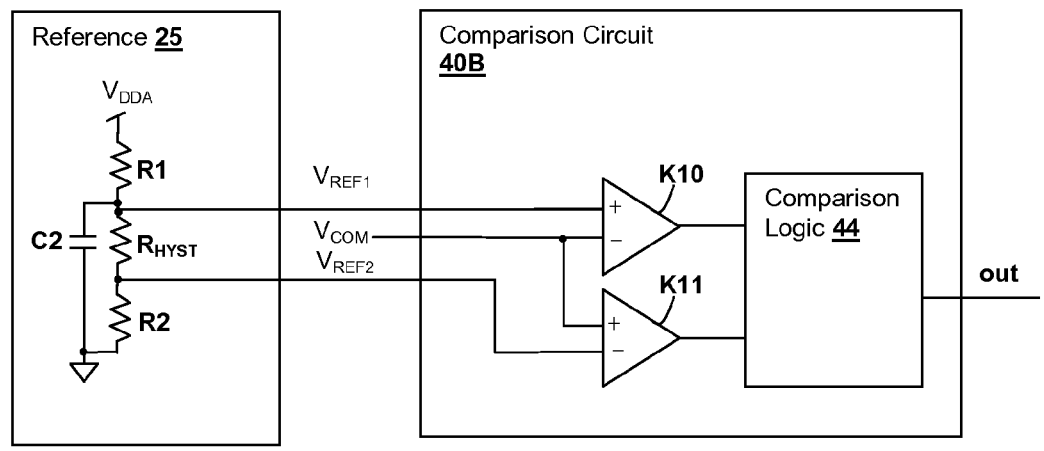
FIG. 3B is a schematic diagram depicting a comparison circuit 40B that may be used to implement comparison circuit 40 in voltage reference circuit 20 of FIG. 2, in accordance with another embodiment of the present invention.

Referring now to FIG. 3B, a comparison circuit 40B that may alternatively be used to implement comparison circuit 40 of FIG. 2, is shown in accordance with an embodiment of the invention. Exemplary comparison circuit 40B includes a hysteresis comparator formed by a pair of comparators K10-K11. As in the circuit of FIG. 3A, one of the inputs to comparators K10-K11 is voltage reference generator output voltage $V_{COM}$. The other input of comparator K10 is provided by a reference voltage $V_{REF1}$ and the other input of comparator K11 is provided by a reference voltage $V_{REF2}$, which are generated by modifying the reference resistor chain in reference circuit 25 of FIG. 2 to include an additional resistor $R_{HYST}$ that sets the hysteresis window of comparison circuit 40B. Comparison circuit 40B represents an analog hysteresis comparison circuit. Comparison logic 44 generates a three level logic output, and therefore digital filter 28 is also modified when using comparison circuit 40B. When voltage reference generator output voltage $V_{COM}$ is greater than voltage $V_{REF1}$, the output of comparator K10 transitions to a low logic level, indicating to comparison logic 44 that a decrement indication in the output out of comparison circuit 40B should be provided to digital filter 28. When voltage reference generator output voltage $V_{COM}$ is less than reference voltage $V_{REF2}$, the output of comparator K11 transitions to a low logic level, indicating to comparison logic 44 that an increment indication in the output out of comparison circuit 40B should be provided by comparison logic 44 to digital filter 28. Otherwise, comparison logic 44 generates an output out that makes no change to the output of digital filter 28, so that the output of digital filter 28 reflects only events outside of the hysteresis band set by resistor $R_{HYST}$.

Figure 4:
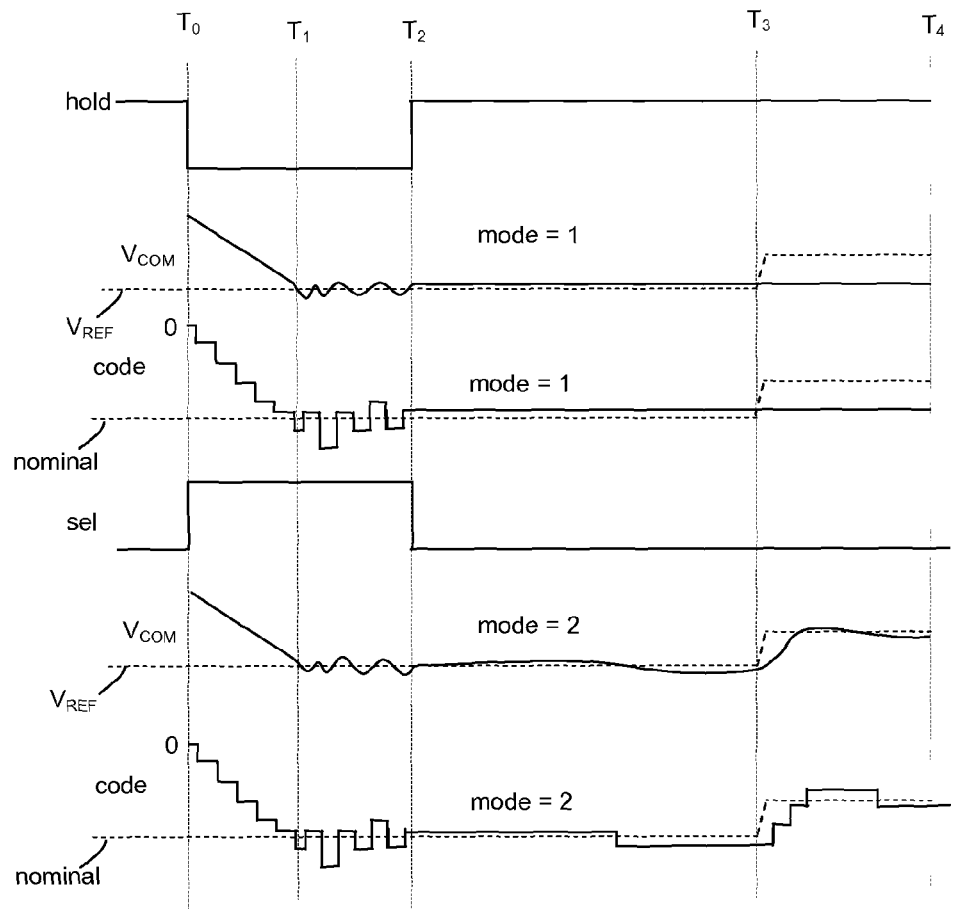
FIG. 4 is a waveform diagram depicting analog signals and representations of digital values in voltage reference 20 of FIG. 2.

Referring now to FIG. 4, a waveform diagram depicting analog waveforms and representations of digital values in voltage reference circuit 20 of FIG. 2 is shown. Only modes 1 and 2 are illustrated; as in the other modes, the output of voltage reference 20 is essentially constant once voltage reference circuit 20 has stabilized. In mode 1, represented by the top three waveforms, during a predetermined period between time $T_0$ and time $T_2$, as determined by timer 32 of FIG. 2, control signal hold is de-asserted and voltage reference generator output voltage $V_{COM}$ ramps downward according to the code shown in waveform code. At time $T_1$, the value of voltage reference generator output voltage $V_{COM}$ has crossed reference voltage $V_{PEF}$ and the digital control loop acts to correct code value code. At time $T_2$, control signal hold is asserted and code value code is set to whatever value code value code assumed at time $T_2$. After time $T_3$, reference voltage $V_{PEF}$ has changed, due to similar changes in analog power supply voltage $V_{DDA}$, but due to the assertion of control signal hold, no change occurs in voltage reference generator output voltage $V_{COM}$.

In mode 2, represented by the bottom three waveforms, during the predetermined period between time $T_0$ and time $T_2$, as determined by timer 32 of FIG. 2, voltage reference generator output voltage $V_{COM}$ ramps downward according to the code shown in waveform code. At time $T_1$, the value of voltage reference generator output voltage $V_{COM}$ has crossed reference voltage $V_{REF}$, and the digital control loop acts to correct code value code. Before time $T_2$ control signal sel is asserted, and the bandwidth of digital filter 28 is set to a wide response that is faster than the response when control signal sel is not asserted. After time $T_2$, control signal sel is de-asserted and code value code changes more slowly, as does the value of voltage reference generator output voltage $V_{COM}$ in response. The changes in voltage reference generator output voltage $V_{COM}$ and code value code between time $T_2$ and time $T_3$ are due to dither and/or the mismatch between the actual value of code value code and the nominal value of code value code that corresponds to the condition voltage reference generator output voltage $V_{COM}$=reference voltage $V_{REF}$. After time $T_3$, when reference voltage $V_{REF}$ changes, code value code and consequently voltage reference generator output voltage $V_{COM}$ change to track the change in reference voltage $V_{REF}$, at the lower response rate due to control signal sel being de-asserted.

While the invention has been particularly shown and described with reference to the preferred embodiments thereof, it will be understood by those skilled in the art that the foregoing and other changes in form and details may be made therein without departing from the spirit and scope of the invention.

What is claimed:
1. A voltage reference circuit, comprising:
a digitally-controlled voltage reference generator for providing a voltage reference generator output, wherein the voltage reference generator output has a DC voltage controlled by a digital input;
a comparison circuit for comparing the voltage reference generator output to another reference voltage level; and
a digital filter for filtering an output of the comparison circuit to provide an output representing a long-term average of the output of the comparison circuit, wherein the output of the digital filter is coupled to the digital input of the digitally-controlled voltage reference, whereby error between the DC voltage of the voltage reference generator output and the another reference voltage level is reduced.

2. The voltage reference circuit of claim 1, wherein the digital filter has a selectable bandwidth and further comprising a control circuit for selecting between a first response of the digital filter and a second response of the digital filter, wherein the digital filter responds to changes in the output of the comparison circuit substantially faster when the first response is selected than when the second response is selected.

3. The voltage reference circuit of claim 2, wherein the control circuit further comprises a timer for causing the control circuit reference circuit to change the selectable bandwidth of the digital filter from the first response to the second response after a predetermined time period has elapsed.

4. The voltage reference circuit of claim 2, further comprising a control circuit for disabling digital control of the digitally-controlled voltage reference generator and providing the output of the voltage reference circuit from a voltage divider for dividing a power supply voltage to provide a voltage divider output, when a first selectable operating mode of the voltage reference circuit is selected.

5. The voltage reference circuit of claim 4, further comprising a digital input register for receiving an externally-supplied control value, and wherein in a second selectable operating mode, the control circuit applies the externally-supplied control value to the digital input of the digitally-controlled voltage reference generator to set the DC voltage.

6. The voltage reference circuit of claim 1, further comprising:
   a digital input register for receiving an externally-supplied control value; and
   a control circuit for selecting between a first operating mode and a second operating mode of the voltage reference circuit, wherein in the first operating mode, the digital input of the digitally-controlled voltage reference generator is provided from the output of the digital filter, and wherein in the second operating mode, the control circuit applies the externally-supplied control value to the digital input of the digitally-controlled voltage reference generator to set the DC voltage.

7. The voltage reference circuit of claim 1, further comprising a control circuit for disabling digital control of the digitally-controlled voltage reference generator and providing the output of the voltage reference circuit from a voltage divider for dividing a power supply voltage to provide a voltage divider output, when a first selectable operating mode of the voltage reference circuit is selected.

8. The voltage reference circuit of claim 1, wherein the digital filter has a hold input for causing the output of the digital filter to assume a constant value when a signal provided to the hold input is asserted.

9. The voltage reference circuit of claim 1, wherein the comparison circuit comprises:
   a single comparator having a first input coupled to the voltage reference generator output and a second input coupled to the another reference voltage level; and
   a dither generator, for generating a dither signal combined with one of the voltage reference generator output or the another reference voltage level at the comparator, and wherein the digital filter implements hysteresis to prevent oscillation at the digital input of the digitally-controlled voltage reference generator.

10. The voltage reference circuit of claim 1, wherein the comparison circuit comprises:
    a first comparator having a first input coupled to the voltage reference generator output and a second input coupled to the another reference voltage level; and
    a second comparator having a first input coupled to the voltage reference generator output and a second input coupled to the another reference voltage level, wherein the first comparator and the second comparator have thresholds offset by a hysteresis amount to prevent oscillation at the digital input of the digitally-controlled voltage reference generator.

11. A method for generating a reference voltage output, comprising:
    generating a voltage reference generator output voltage according to a digital input value;
    comparing the voltage reference generator output to another reference voltage level; and
    digitally filtering a result of the comparing to provide an output representing a long-term average of the comparing; and
    providing a result of the digitally filtering to the generating as the digital input value, whereby error between the voltage reference generator output voltage and the another reference voltage level is reduced.

12. The method of claim 11, further comprising selecting a bandwidth of the digitally filtering to select between a first response of the digital filter and a second response of the digital filter, wherein the digitally filtering responds to changes in the result of the comparing substantially faster when the first response is selected than when the second response is selected.

13. The method of claim 12, wherein the selecting is performed in response to a timer that causes selection of the second response after a predetermined time period has elapsed.

14. The method of claim 12, further comprising:
    dividing a power supply voltage to provide a voltage divider output;
    selecting between a result of the dividing and digital control of the voltage reference generator output for providing the voltage reference output, according to a selected operating mode of the voltage reference circuit.

15. The method of claim 14, further comprising:
    receiving an externally-supplied digital control value; and
    responsive to selection of a second operating mode, applying the externally-supplied digital control value to the generating to set the voltage reference generator output voltage.

16. The method of claim 11, further comprising:
    receiving an externally-supplied digital control value;
    responsive to selection of a first operating mode, performing the providing the result of the digitally filtering to the generating; and
    responsive to selection of a second operating mode, applying the externally-supplied digital control value to the generating to set the voltage reference generator output voltage instead of performing the providing the result of the digitally filtering to the generating.

17. The method of claim 11, further comprising:
    dividing a power supply voltage to provide a voltage divider output;
    selecting between a result of the dividing and digital control of the voltage reference generator output for providing the voltage reference output, according to a selected operating mode of the voltage reference circuit.

18. The method of claim 11, further comprising holding the result of the digital filtering constant after a predetermined time period has elapsed.

19. An integrated circuit comprising:
- a digitally-controlled voltage reference generator for providing a voltage reference generator output, wherein the voltage reference generator output has a DC voltage controlled by a digital input;
- a comparison circuit for comparing the voltage reference generator output to another reference voltage level; and
- a digital filter for filtering an output of the comparison circuit to provide an output representing a long-term average of the output of the comparison circuit, wherein the output of the digital filter is coupled to the digital input of the digitally-controlled voltage reference, whereby error between the DC voltage of the voltage reference generator output and the another reference voltage level is reduced.

20. The integrated circuit of claim 19, wherein the digital filter has a selectable bandwidth and further comprising a control circuit for selecting between a first response of the digital filter and a second response of the digital filter, wherein the digital filter responds to changes in the output of the comparison circuit substantially faster when the first response is selected than when the second response is selected.

* * * * *